United States Patent
Lee et al.

(10) Patent No.: US 10,153,337 B2
(45) Date of Patent: Dec. 11, 2018

(54) FLEXIBLE DISPLAY DEVICE AND METHOD FOR MANUFACTURING THE SAME

(71) Applicant: LG Display Co., Ltd., Seoul (KR)

(72) Inventors: Chanwoo Lee, Paju-si (KR); Jonghyun Park, Goyang-si (KR); Sungjoon Min, Gimpo-si (KR); Kwonhyung Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/853,738

(22) Filed: Dec. 23, 2017

(65) Prior Publication Data

US 2018/0182839 A1 Jun. 28, 2018

(30) Foreign Application Priority Data

Dec. 28, 2016 (KR) .................. 10-2016-0181601

(51) Int. Cl.
*H01L 27/32* (2006.01)
*H01L 51/52* (2006.01)
*H01L 25/18* (2006.01)
*H01L 51/56* (2006.01)
*H01L 25/00* (2006.01)
*G09G 3/3266* (2016.01)
*G09G 3/3275* (2016.01)
*H01L 23/535* (2006.01)
*H01L 23/538* (2006.01)
*H01L 23/52* (2006.01)
(Continued)

(52) U.S. Cl.
CPC ....... *H01L 27/3279* (2013.01); *G09G 3/3266* (2013.01); *G09G 3/3275* (2013.01); *H01L 23/52* (2013.01); *H01L 23/535* (2013.01); *H01L 23/538* (2013.01); *H01L 23/5386* (2013.01); *H01L 23/5387* (2013.01); *H01L 25/18* (2013.01); *H01L 25/50* (2013.01); *H01L 51/5253* (2013.01); *H01L 51/56* (2013.01); *G09G 2310/08* (2013.01); *H01L 25/167* (2013.01); *H01L 51/003* (2013.01); *H01L 2227/323* (2013.01); *H01L 2227/326* (2013.01); *H01L 2251/5338* (2013.01)

(58) Field of Classification Search
CPC ..... H01L 25/18; H01L 25/50; H01L 51/5253; H01L 51/56; H01L 23/52; H01L 23/535; H01L 23/538; H01L 23/5386; H01L 23/5387
See application file for complete search history.

(56) References Cited

U.S. PATENT DOCUMENTS

2011/0227487 A1* 9/2011 Nichol ................ G02B 6/0018
315/158

* cited by examiner

*Primary Examiner* — Fei Fei Yeung Lopez
(74) *Attorney, Agent, or Firm* — Polsinelli PC

(57) ABSTRACT

A flexible display device comprises a substrate having a flat portion and a curved portion, wherein a pixel array is provided in the flat portion and a pad portion connected to the pixel array is provided in the curved portion; and an encapsulation layer provided on the substrate to cover the pixel array, wherein the encapsulation layer comprises a terminal portion; an Integrated Circuit (IC) portion having at least one driving IC; and a lead portion having leads which connect the terminal portion and the driving IC portion, and wherein the curved portion of the substrate is bent so that the pad portion and the terminal portion are in contact with each other.

20 Claims, 17 Drawing Sheets

THIRD STEP

(51) Int. Cl.
*H01L 51/00* (2006.01)
*H01L 25/16* (2006.01)

RELATED ART

RELATED ART

FIRST STEP

SECOND STEP

THIRD STEP

FLEXIBLE DISPLAY DEVICE AND METHOD FOR MANUFACTURING THE SAME

CROSS-REFERENCE TO RELATED APPLICATION

This application claims the benefit of Korean Patent Application No. 10-2016-0181601 filed on Dec. 28, 2016, which is incorporated herein by reference in its entirety for all purposes as if fully set forth herein.

BACKGROUND

Field of the Disclosure

The present disclosure relates to a display device, and more particularly, to a flexible display device, and a method for manufacturing the same. Although the present disclosure is suitable for a wide scope of applications, it is particularly suitable for a flexible display device and a method for manufacturing the same without using a flexible film.

Description of the Background

With development of the information technologies, there are growing demands for a display device, which can be a medium for connecting a user to information. Accordingly, the display device, such as an organic light emitting display device, a liquid crystal display (LCD) and a plasma display panel (PDP), has been widely used.

Among them, the organic light emitting display device is a self-emitting element, and thus it may consume less power than the LCD, which requires a backlight, and may be made thinner than the LCD. In addition, the organic light emitting display has advantages of a wide viewing angle and a fast response speed. Technologies of manufacturing an organic light emitting display has improved so much that it is possible to produce a massive number of large screens. Now the market demand for organic light emitting displays is growing to be comparable with LCDs.

Pixels in an organic light emitting display device include a self-emitting organic light Emitting diode (OLED). Organic light emitting display devices may be divided by a type of emission material, an emission type, an emission structure, or a driving method. Organic light emitting display devices may be divided by an emission type into florescent emission and phosphorescent emission, or may be divided by an emission structure into a top-emission structure and a bottom-emission structure. In addition, organic light emitting display devices may be divided by a driving method into a passive matrix OLED (PMOLED) and an active matrix OLED (AMOLED).

As flexible display devices are widely used these days, various types of display devices have been developed. The flexible display devices may be implemented as various types, such as a bendable display device, a foldable display device, rollable display device, and a curved display device. Such flexible display devices may be applied not just to mobile devices, such as smart phones and table PCs, but to TVs, automobile displays, and wearable devices. It means that the flexible display devices can be applicable in many fields.

SUMMARY

Accordingly, the present disclosure is directed to a flexible display device, and a method for manufacturing the same that substantially obviate one or more of problems due to limitations and disadvantages of the prior art.

Additional features and advantages of the disclosure will be set forth in the description which follows and in part will be apparent from the description, or may be learned by practice of the invention. Other advantages of the present disclosure will be realized and attained by the structure particularly pointed out in the written description and claims hereof as well as the appended drawings.

Aspects of the present disclosure provide a flexible display device and a method for manufacturing the same, wherein the flexible display device is able to be applied to various fields because a flexible film in the form of chip on film (COF) or a tape carrier package (TCP) has been removed from the flexible display device.

In one aspect, a flexible display device comprises a substrate having a flat portion and a curved portion, wherein a pixel array is provided in the flat portion and a pad portion connected to the pixel array is provided in the curved portion; and an encapsulation layer provided on the substrate to cover the pixel array, wherein the encapsulation layer comprises a terminal portion; an Integrated Circuit (IC) portion having at least one driving IC; and a lead portion having leads which connect the terminal portion and the driving IC portion, and wherein the curved portion of the substrate is bent so that the pad portion and the terminal portion are in contact with each other.

In another aspect, a method for manufacturing a flexible display device comprises forming a substrate on a support substrate having a specific level of rigidity; forming a pixel array and a pad portion connected to the pixel array on the substrate, and forming an encapsulation layer covering the pixel array; forming a terminal portion, an Integrated Circuit (IC) portion, and a lead portion on the encapsulation layer; removing the support substrate; and bending an end portion of the substrate, in which the pad portion is provided, to align the pad portion on the substrate and the terminal portion on the encapsulation layer, and bonding the pad portion and the terminal portion with an anisotropic conductive film (ACF) layer therebetween.

In a further aspect, a flexible display device comprises a substrate having a flat portion and a curved portion, wherein a pixel array and a pad portion are formed on the flat portion of a non-display region and the pad portion electrically connects the pixel array and the curved portion of the substrate; an encapsulation layer on the substrate and covering the pixel array, wherein the encapsulation layer includes a terminal portion and an integrated circuit portion, and the terminal portion and the pad portion contact each other; and a plurality of input leads and a plurality of output leads connecting the terminal portion and the integrated circuit portion, wherein the plurality of input leads and the plurality of the output leads are distributed sufficient enough on the encapsulation layer not to restrict change in state of the flexible display device.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the present disclosure and are incorporated in and constitute a part of the disclosure, illustrate aspects of the disclosure and together with the description serve to explain the principles of the disclosure.

In the drawings.

DETAILED DESCRIPTION

Reference will now be made in detail to aspects of the disclosure, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the aspects of the disclosure. In the descriptions of various aspects, the same element may be described in a preceding aspect and may not be described in a following aspect.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. Unless otherwise indicated, the singular forms include the plural forms.

Figure 1:
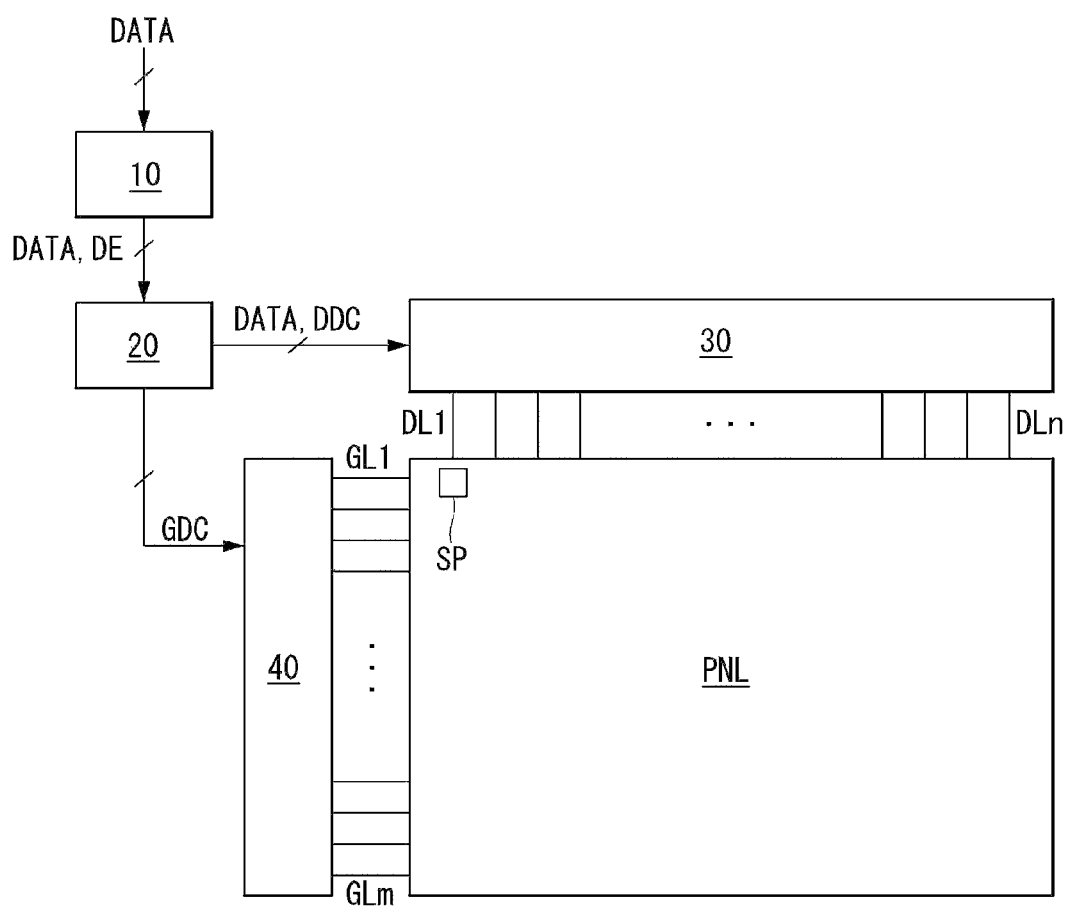
FIG. 1 is a schematic block diagram illustrating a flexible display device.
Figure 2:
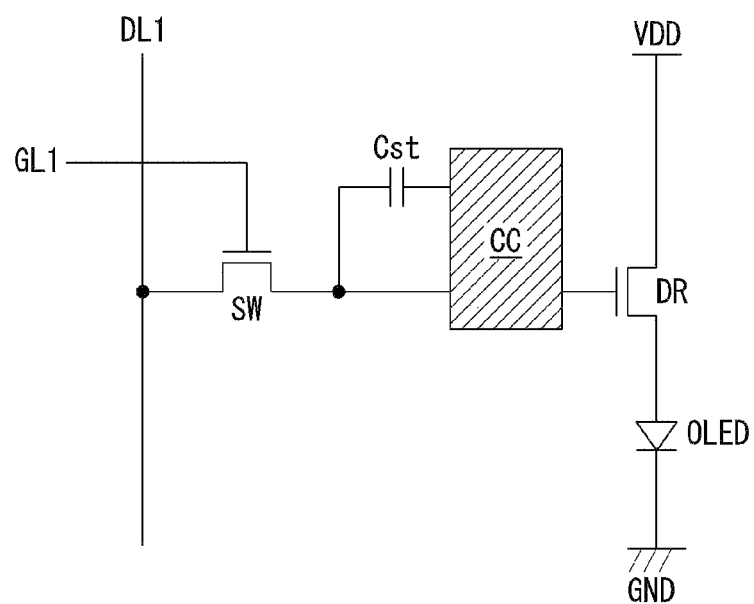
FIG. 2 is a diagram illustrating an exemplary circuit configuration of a sub-pixel.
Figure 3:
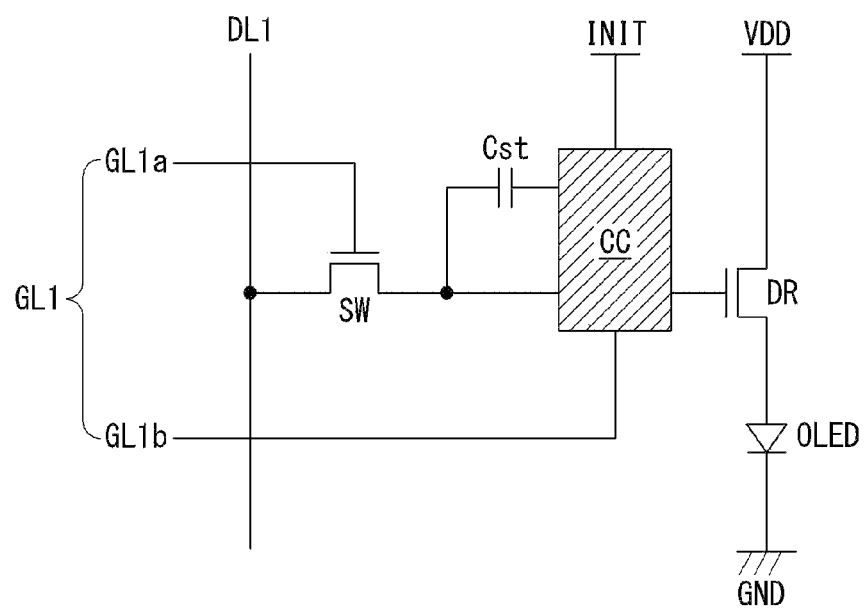
FIG. 3 is an exemplary diagram illustrating another exemplary circuit configuration of a sub-pixel.
Figure 4A:
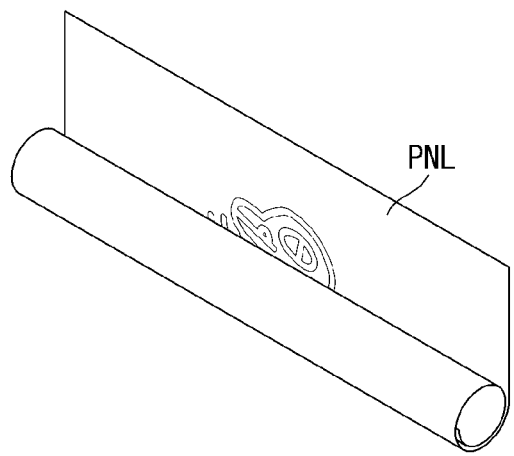
FIGS. 4A to 4D are diagrams illustrating examples of various use of a flexible display device.
Figure 4B:
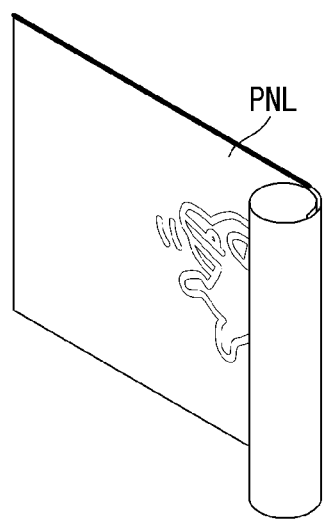
Figure 4C:
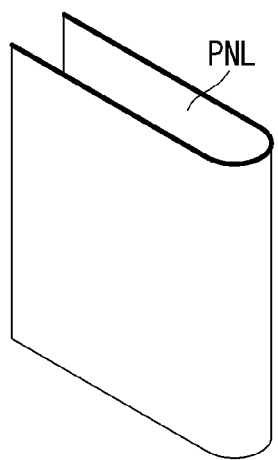
Figure 4D:
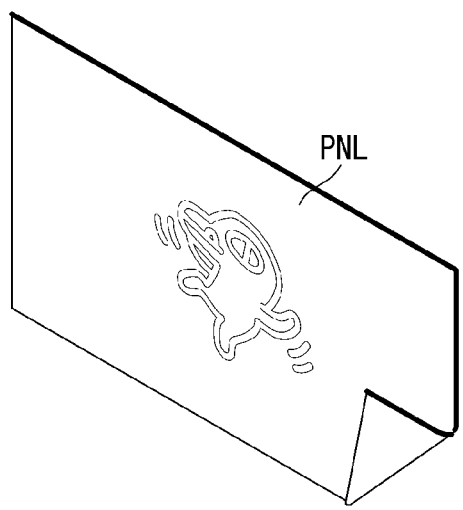

FIG. 1 is a schematic block diagram illustrating a flexible display device. FIG. 2 is a diagram illustrating an exemplary circuit configuration of a sub-pixel. FIG. 3 is an exemplary diagram illustrating another exemplary circuit configuration of a sub-pixel. FIG. 4 is a cross-sectional view schematically illustrating a flexible display device.

Referring to FIG. 1, a flexible display device includes an image processor 10, a timing controller 20, a data driver 30, a gate driver 40, and a display panel PNL.

The image processor 10 outputs a data enable signal DE in addition to a data signal DATA, which is supplied from the outside source. The image processor 10 may output at least one of a vertical synchronization signal, a horizontal synchronization signal, and a clock signal in addition to the data enable signal DE, but these signals are not depicted for convenience of explanation. The image processor 10 may be form as an integrated circuit on a system circuit board.

The timing controller 20 is supplied from the image processor 10 with a data signal DATA in addition to a data enable signal DE or a driving signal which includes a vertical synchronization signal, a horizontal synchronization signal, and a clock signal.

Based on the driving signal, the timing controller 20 outputs a timing control signal GDC for controlling operation timing of the gate driver 40, and a timing control signal DDC for controlling operation timing of the data driver 30. The timing controller 20 is formed as an IC on a control circuit board.

In response to the data timing control signal DDC supplied from the timing controller 20, the data driver 30 samples and latches the data signal DATA supplied from the timing controller 20, converts the data signal DATA into a gamma reference voltage, and outputs the gamma reference voltage. The data driver 30 outputs a data signal DATA along data lines DL1 to DLn. The data driver 20 is in the form of an IC attached to a substrate.

In response to the timing control signal GDC supplied from the timing controller 20, the gate driver 40 outputs a gate signal while shifting a level of a gate voltage. The gate driver 40 outputs a gate signal along gate lines GL1 to GLm. The gate driver 40 is in the form of an IC on a gate circuit board or a gate in panel (GIP) circuit on the display panel PNL.

The display panel PNL displays an image in response to a data signal DATA from the data driver 30 and a gate signal from the gate driver 40. The display panel PNL includes a plurality of sub-pixels SP for displaying an image.

Referring to FIG. 2, each sub-pixel includes a switching transistor SW, a driving transistor DR, a compensation circuit CC, and an organic light emitting diode (OLED). The OLED operates to emit light by a driving current that is formed by the driving transistor DR. The OLED includes an emission layer composed of an organic material, and the emission layer is between a first electrode, which is an anode, and a second electrode, which is a cathode. Thus, a hole from the first electrode and an electron from the second electrode are combined to form an exciton, which is a hole-electron pair, and the OLED emits light by energy that is generated when the exciton returns to the ground state.

In response to a gate signal supplied along a first gate line GL1, the switching transistor SW performs switching operation so that a data signal supplied along a first data line DL1 is stored in a capacitor as a data voltage. The driving transistor DR operates to enable a driving current to flow between a high-potential power line VDD and a low-potential power line GND by a data voltage stored in the capacitor. The compensation circuit CC is a circuit for compensation of a threshold of the driving transistor DR. In addition, the capacitor connected to the switching transistor SW or the driving transistor DR may be disposed inside of the compensation circuit CC.

The compensation circuit CC is composed of one or more thin film transistors (TFTs) and a capacitor. Configuration of the compensation circuit varies depending on a compensation method, and thus, detailed examples and description thereof are herein omitted.

In addition, as illustrated in FIG. 3, when the compensation circuit CC is included, a sub-pixel further includes a signal line and a power line to supply a specific signal or power while driving a compensation TFT. The added signal line may be defined as a 1-2 gate line GL1b for driving the compensation TFT included in the sub-pixel. In FIG. 3, "GL1a" is a 1-1 gate line for driving the switching transistor SW. In addition, the added power line may be defined as an initialization line INIT for initializing a specific node of the sub-pixel to a specific voltage. However, this is merely exemplary and aspects of the present disclosure are not limited thereto.

Meanwhile, FIGS. 2 and 3 illustrate examples in which a sub-pixel includes a compensation circuit CC. However, if a subject of compensation is, for example, the data driver 30 which is located outside of a sub-pixel, the compensation circuit CC may be omitted. That is, a sub-pixel may be basically in a 2T (Transistor) 1C (Capacitor) structure which includes a switching transistor SW, a driving transistor DR, a capacitor, and an OLED. However, if a compensation circuit CC is added, a sub-pixel may be in any of various structures such as 3T1C, 4T2C, 5T2C, 6T2C, and 7T2C.

In addition, FIGS. 2 and 3 illustrate examples in which a compensation circuit CC is disposed between the switching transistor SW and the driving transistor DR, but the compensation circuit CC may be further disposed between the driving transistor DR and the OLED. The location and configuration of the compensation circuit CC are not limited to what is shown in FIGS. 2 and 3.

FIGS. 4A to 4D are diagrams illustrating examples of various use of a flexible display device.

Referring to FIG. 4, the display panel PNL includes a display region in which an input image is displayed. Through the display region, a user may recognize information output from the display panel PNL.

The display panel PNL may be rolled or unrolled. That is, it is possible for the flexible display panel 100 to be rolled (or wound) and unrolled (or unwound) easily and repeatedly since it has flexibility. The display panel PNL may be rolled in various directions, when necessary. For example, the display panel PNL may be rolled in a horizontal and/or vertical direction and may be rolled in a diagonal direction. The display panel PNL may be rolled in the front surface direction and/or the rear surface direction of the display panel PNL. The front surface direction may be defined as a direction in which a user is located, and the rear surface direction may be defined as a direction opposite to the front surface direction with respect to the display panel, which is a direction in which a user is not located.

Rolling and unrolling of the display panel PNL (which is hereinafter referred to as a change in state) may be caused by a physical force directly provided by a user. For example, the user may change a state of the flexible display device by gripping one end of the flexible display device and applying force thereto. Change in a state of the flexible display device may be controlled by a controller in response to a predetermined specific signal. That is, change in a state of the flexible display device may be controlled by a selected driving device or a driving circuit.

Figure 5:
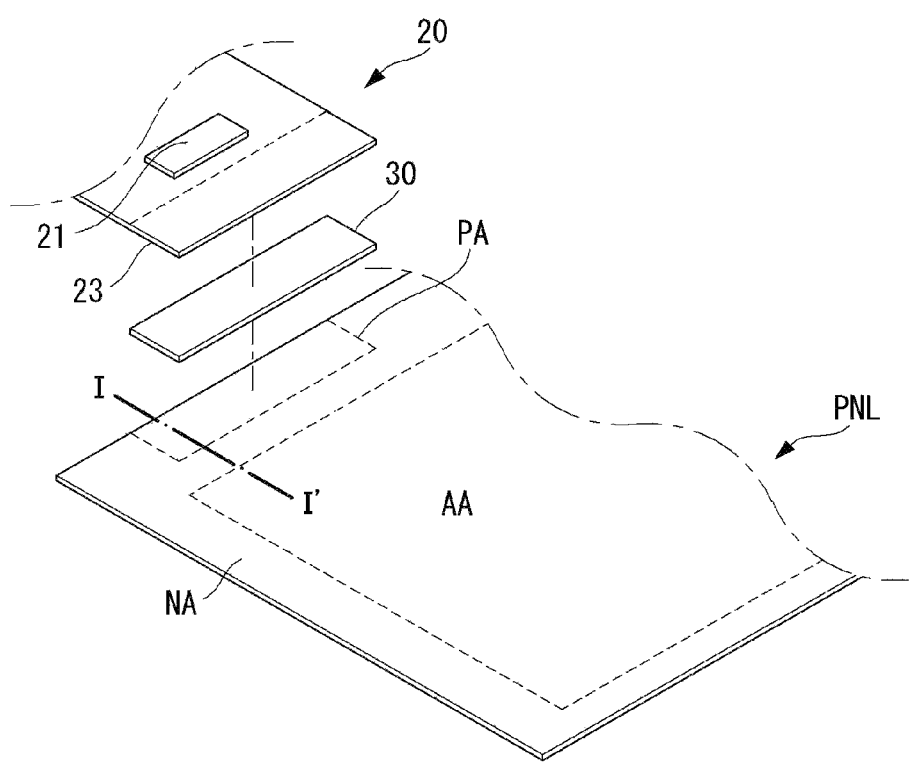
FIGS. 5 and 6 are diagrams for explanation of a problem of a flexible display device.
Figure 6:
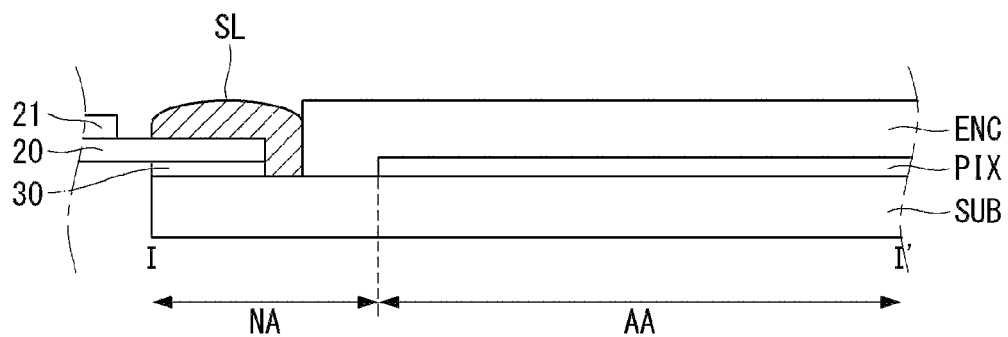

FIGS. 5 and 6 are diagrams for explanation of a problem of a flexible display device. FIG. 5 is a perspective view of a schematic structure of a flexible display device. FIG. 6 is a cross-sectional view of FIG. 5 cut along line I-I'.

Referring to FIG. 5, a flexible display device according to the present disclosure includes a display panel PNL, a flexible film 20, and an anisotropic conductive film (ACF) layer 30.

The display panel PNL includes a display region in which an input image is displayed, and a non-display region NA which is outside of the display region AA. A pad portion PA is defined in one side of the non-display region NA. Pads are provided in the pad portion PA, and the pads are connected to signal lines for transferring a driving signal to the display region AA.

The flexible film 20 may be implemented as chip on film (COF) or tape carrier package (TCP). The flexible film 20 includes a base film 23, and a driver integrated circuit (IC) 21 mounted on the base film 23. One end of the flexible film 20 is attached to the pad portion PA of the display panel PNL, and the other end is connected to a printed circuit board (PCB). A plurality of elements, such as ICs, is formed on the PCB to constitute a driver. The driver generates various control signals and data signals, which is for driving the display panel PNL, and data signals, and transfers the signals to the display panel PNL.

The ACF layer 30 includes an adhesive resin and conductive particles spread inside the ACF layer 30. The ACF layer 30 is disposed between the pad portion PA of the display panel PNL and one end of the flexible film 20, and the conductive particles are connected to each other by a heat press to electrically connect the display panel PNL and the flexible film 20.

Referring to FIG. 6, the flexible display device includes a substrate SUB, a pixel array PIX, an encapsulation layer ENC, and a flexible film 20.

A display region AA and a non-display region NA are defined on the substrate SUB. The substrate SUB may be composed of a flexible material that can be bent.

The pixel array PIX includes a plurality of pixels. Each pixel includes a plurality of elements, such as a thin film transistor (TFT) and an organic light emitting diode (OLED) connected to the TFT. The R (red), G (green), and B (blue) pixels or R, G, B, and W (white) pixels are arranged in the display area AA to realize full colors. The pixels may be partitioned by gate lines and data lines intersecting each other.

The encapsulation layer ENC is disposed on the pixel array PIX. The encapsulation layer ENC is provided to cover the pixel array PIX to block moisture or oxygen which could possibly come inside the pixel.

The flexible film 20 is attached to the pad portion PA arranged in the non-display region NA of the substrate SUB. The pad portion PA is connected to the pixel array PIX to transfer a signal to pixels. The ACF layer 30 is provided between the pad portion PA and the flexible film 20. A side sealant SL may be further provided in the non-display region NA of the substrate SUB. The side sealant SL extends to the edge of the top surface of the flexible film 20 to fix the flexible film 20 attached to the substrate SUB, thereby restricting and limiting movement of the flexible film 20. The side sealant SL may prevent the flexible film 20 from peeling off and protect a portion where the substrate SUB and the flexible film 20 are attached to each other.

Because the flexible film 20 is located in the non-display region NA of the substrate SUB, an increase in area occupied by the flexible film 20 means an increase in a bezel region. An increase in the bezel region may lower a user's immersion and degrade an esthetic appearance.

In order to reduce the bezel region, the flexible film 20 may be formed to have a minimum area on which a driving IC 21 and leads connected to the driving IC 21 are able to be mounted. If a rigid driving IC 21 is mounted in a limited space on the flexible film 20, it may be difficult to change in a state of the flexible film 20 despite of the flexibility of the flexible film 20. Thus, a region in which the flexible film 20 is arranged is not just a bezel region, but also a non-rolling region. An increase in the non-rolling region may reduce user convenience and cause a limitation in applying the flexible display device to various fields, such as a wearable device.

In addition, the attached substrate SUB and the flexible film 20 on which the rigid driving IC 21 is amounted have a significant difference in terms of flexibility. Accordingly, a defect which is distortion between the substrate SUB and the flexible film 20 may occur during a process and/or upon change in a state of the display panel PNL, and this may lead to a contact error between the substrate SUB and the flexible film 20 and thus signals may not be transmitted properly.

To reduce the bezel region and the non-winding region, reducing a contact area between the substrate SUB and the flexible film 20 may be considered. In this case, the display device may malfunction because the flexible film 20 is separate from the substrate SUB by an external force applied upon the change in state of the display panel PNL.

Figure 7:
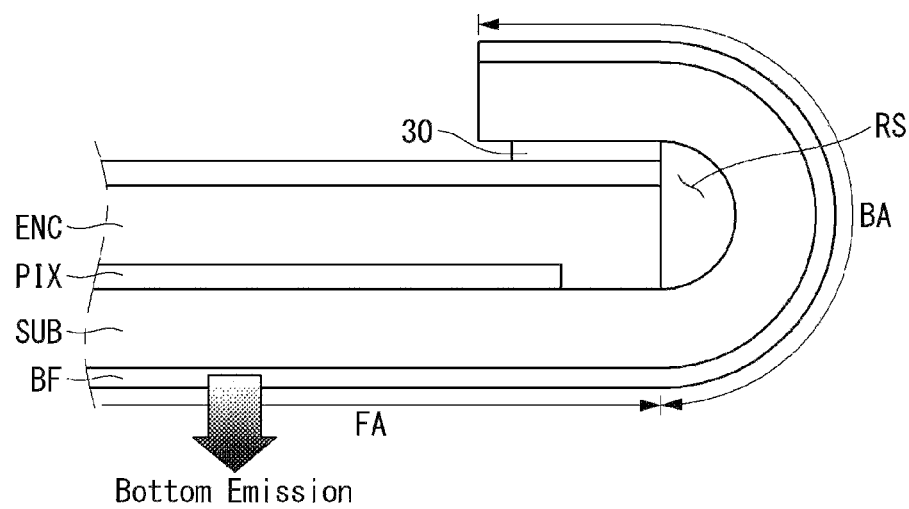
FIG. 7 is a cross-sectional view of a flexible display device according to an aspect of the present disclosure.
Figure 8A:
FIGS. 8A to 8C are diagrams illustrating an exemplary configuration of an encapsulation layer.
Figure 8B:
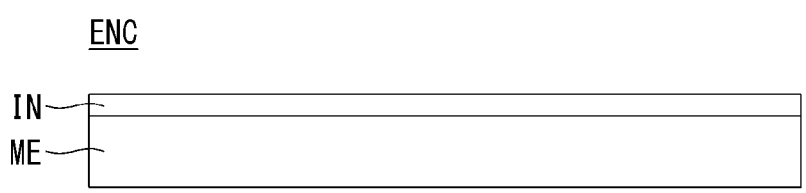
Figure 8C:
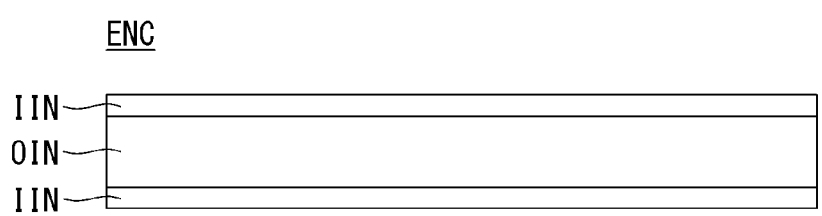
Figure 9:
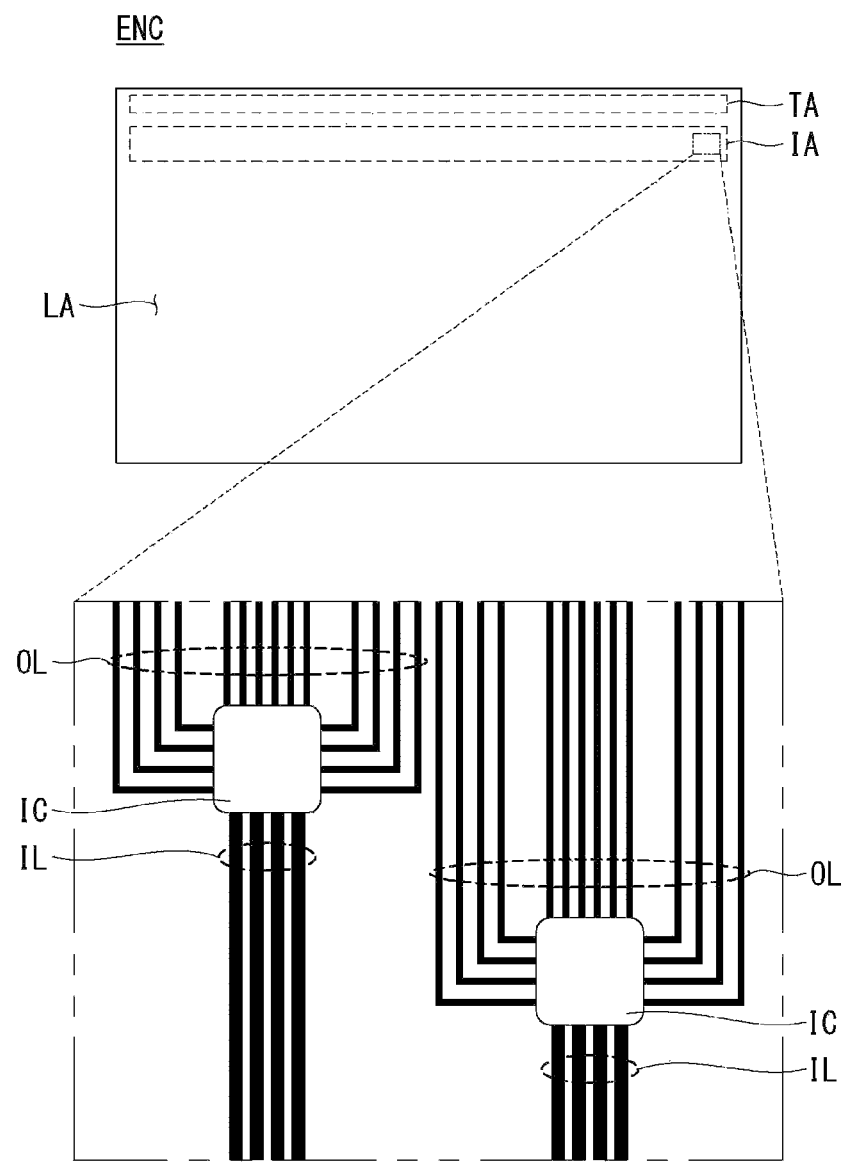
FIG. 9 is a plan view illustrating an encapsulation layer according to an aspect of the present disclosure.
Figure 10A:
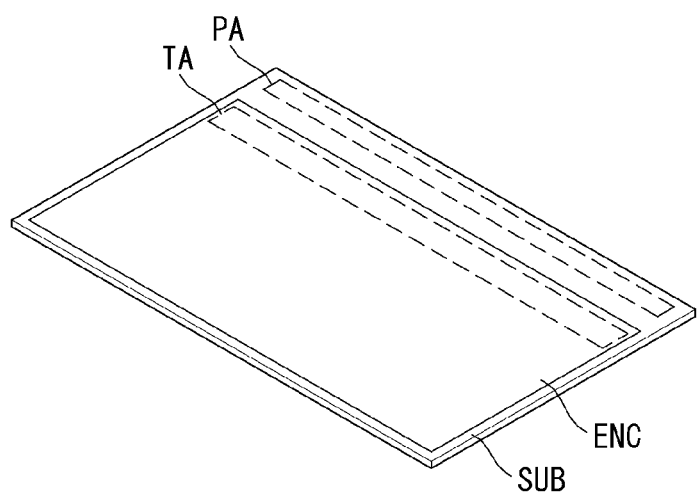
FIGS. 10A to 10C are a perspective view illustrating a flexible display device according to an aspect of the present disclosure.
Figure 10B:
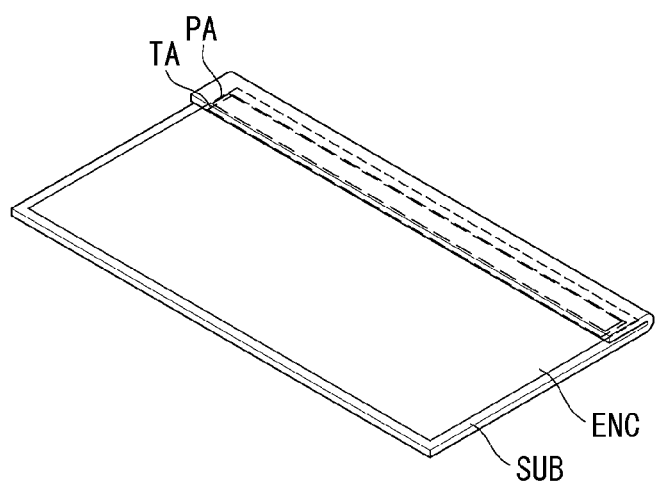
Figure 10C:
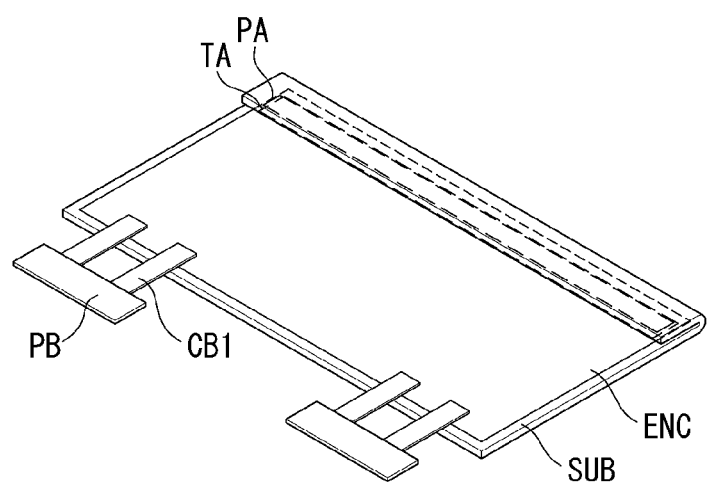

FIG. 7 is a cross-sectional view of a flexible display device according to an aspect of the present disclosure. FIGS. 8A to 8C are diagrams illustrating an exemplary configuration of an encapsulation layer. FIG. 9 is a plan view illustrating an encapsulation layer according to an aspect of the present disclosure. FIG. 10 is a perspective view illustrating a flexible display device according to an aspect of the present disclosure.

Referring to FIGS. 7 and 10, the flexible display device according to an aspect of the present disclosure may include a substrate SUB, a pixel array PIX and an encapsulation layer ENC.

A display region and a non-display region are defined in the substrate SUB. The non-display region NA includes a pad portion PA having a plurality of pads. Each of the pads in the pad portion PA is connected to signal lines for transferring a driving signal to the display region AA.

The substrate SUB may be formed of a flexible material that can be bent. For example, the substrate SUB may be formed of PI (Polyimide), PET (polyethylene terephthalate), PEN (polyethylene naphthalate), PC (polycarbonate), PES (polyethersulfone), PAR (polyarylate), PSF (polysulfone), COC (ciclic-olefin copolymer), or the like.

The substrate SUB includes a flat portion FA and a curved portion BA. The flat portion FA corresponds to a display region in which a pixel array PIX having a plurality of pixels is arranged, and the flat portion FA is a region which remains flat state when there is no change in state of the display panel. The curved portion BA corresponds to a region in which signal lines for connecting the display region and the pad portion PA are provided, and the curved portion BA is a region which remains curved state with a specific curvature when there is no change in state of the display panel.

For example, the curved portion BA may be in a reverse "c" shape. That is, the curved portion BA may extend from the flat portion FA to be bent at 180° in a rear surface direction, and an end portion of the curved portion BA may be located to partially overlap the flat portion FA in a direction toward the rear surface of the flat portion FA.

In an aspect of the present disclosure, the pad portion PA is disposed in the curved portion BA and bent in the rear surface direction of the flat portion FA, and thus, a non-display region to be recognized from the front surface of the flexible display device may be reduced. Accordingly, it is possible to reduce the bezel region which is recognized from the front surface of the flexible display device.

The flexible display device may further include a back film BF. The back film BF may be disposed below the substrate SUB to support the substrate SUB. The back film BF may reinforce rigidity of the substrate SUB, and may block moisture and oxygen from coming inside from the bottom of the substrate SUB. The back film BF may be formed of a polymer-based material.

The pixel array PIX includes a plurality of pixels. Each of the pixels includes a TFT and an OLED connected to the TFT. R, G, and B pixels or R, G, B, and W pixels are arranged in the display region to realize full colors. The pixels may be partitions by gate lines and data lines which intersect each other. The flexible display device according to the present disclosure is implemented as a bottom emission type. Thus, light emitted from the OLED passes through the substrate SUB and is then recognized by a user.

The encapsulation layer ENC is disposed above the pixel array PIX. The encapsulation layer ENC may be provided to cover the pixel array PIX in order to block moisture or oxygen which could possibly come inside of the pixels.

The encapsulation layer ENC may be a film sheet FM. The film sheet FM may be a single layer of a material selected from COP (cyclic olefin polymer), PET (polyethylene terephthalate), PEN (polyethylene naphthalate), PC (polycarbonate), PI (polyimide), PTFE (polytetrafluoroethylene), PE (polyethylene), HDPE (high density polyethylene), PP (polypropylene), PES (polyethersulfone), PS (polystyrene), and PVC (polyvinyl chloride), or may be deposited multi-layers (shown in FIG. 8A).

The encapsulation layer ENC may be a metal sheet ME. The metal sheet ME may be formed of a metal material, such as an invar, which is a Fe—Ni alloy, with a low-thermal expansion coefficient, or may be formed of stainless steel. In the case where the encapsulation layer ENC is the metal sheet ME, the encapsulation layer ENC further includes an insulation layer IN formed on the metal sheet ME. The insulation layer IN is a single layer selected from an organic insulation material or an inorganic insulation material, or may be deposited multi-layers of an organic insulation material and an inorganic insulation material (shown in FIG. 8B).

The encapsulation layer ENC may be in a structure in which an inorganic layer IIN and an organic layer OIN are deposited. The inorganic layer IIN may be formed of an inorganic insulation material, such as $SiO_2$ and $SiN_x$, and the organic layer may be formed of an organic insulation material, such as a polymer. The encapsulation layer ENC may be multi-layers in which the inorganic layer IIN and the organic layer OIN are deposited alternatively (shown in FIG. 8C).

As shown in FIG. 9, the encapsulation layer ENC includes a terminal portion TA, an IC portion IA, and a lead portion LA. In the case where the encapsulation layer ENC is a metal sheet, at least one insulation layer is further provided on the metal sheet. The flexible display device according to an aspect of the present disclosure is in a structure in which a flexible film 20 (shown in FIG. 5) having driving ICs IC mounted thereon and implemented as a COF or a TCP has been removed.

The terminal portion TA includes terminals (or bumps) which are adhered through pads of the pad portion PA and the ACF layer 30. The IC portion IA includes driving ICs IC mounted on the encapsulation layer ENC.

As described above, when driving ICs (IC) having a specific rigidity are densely mounted in a limited space, it is difficult to secure a specific level of flexibility corresponding to a change in state of the display panel. In order not to limit and restrict the change in state of the display panel, an aspect of the present disclosure may be implemented such that the driving ICs (IC) are relatively widely distributed over the encapsulation layer ENC. In addition, in order not to limit and restrict the change in state of the display panel, the driving ICs (IC) needs to be distributed and mounted in a relatively small size. In addition, in order not to limit and restrict the change in state of the display panel, the driving ICs (IC) may be arranged in a zig-zag pattern in one direction (or alternately arranged in a horizontal direction). In an aspect of the present disclosure, the driving ICs (IC) are formed on the encapsulation layer ENC having a relatively large area (or size), thereby securing freedom of design and avoid limitation and restriction to change in state of the display panel. This means that a region where the driving ICs (IC) are provided may be a rolling region.

The lead portion LA includes input leads IL and output leads OL, which are formed on the encapsulation layer ENC. The input leads IL are connected via a first connection member CB1 to a printed circuit board (PCB) PB provided outside of the substrate, thereby electrically connecting the PCB PB and the driving ICs IC. The fist connection member CB1 may be a cable, such as a flexible flat cable (FFC), but aspects of the present disclosure is not limited thereto. For example, one end of the first connection member CB1 may be connected to one side of the encapsulation layer ENC via the ACF, and the other end of the first connection member CB1 may be connected to a connector (not shown) mounted on the PCB PB.

The output lead OL may connect the driving ICs IC and the terminal portion TA. On the encapsulation layer ENC, the input leads IL, the driving ICs IC, and output leads OL may be electrically connected to form a signal transmission path. Although not illustrated in drawings, a solder resist may be further provided on the input leads IL and the output leads OL. The solder resist may prevent a defect which is, for example, oxidation of the input leads IL and the output leads OL due to exposure to the outside.

In an aspect of the present disclosure, the input leads IL and the output leads OLS may be relatively widely distributed over a large-sized encapsulation layer ENC in order not to limit and restrict change in state of the display panel. Thus, the input leads IL and the output leads OL may be arranged with a sufficient distance from each other, thereby possibly minimizing signal interference therebetween. In addition, the input leads IL and the output leads OL may be formed to have a relative wide width, thereby possibly reducing line resistance. In this case, the input leads IL and the output leads OL may achieve a specific level of rigidity, so that it is possible to minimize a probability of crack to occur in the input leads IL and the output leads OL, the crack which is caused by an external force applied when a state of the display panel is changed. In an aspect of the present disclosure, the input leads IL and the output leads OL are formed on a relatively large-sized encapsulation layer ENC, thereby securing freedom of design and refraining from limiting and restricting change in state of the display panel.

An aspect of the present disclosure may further include resin RS (shown in FIG. 7) that is filled in an inner space which is formed by bending of the curved portion BA of the substrate SUB. The resin RS may block moisture and oxygen which could come inside from the outside along the curved portion BA. With being filled in the inside space, the resin RS may support the substrate SUB and accordingly prevent any unintended distortion of the substrate SUB.

Figure 11:
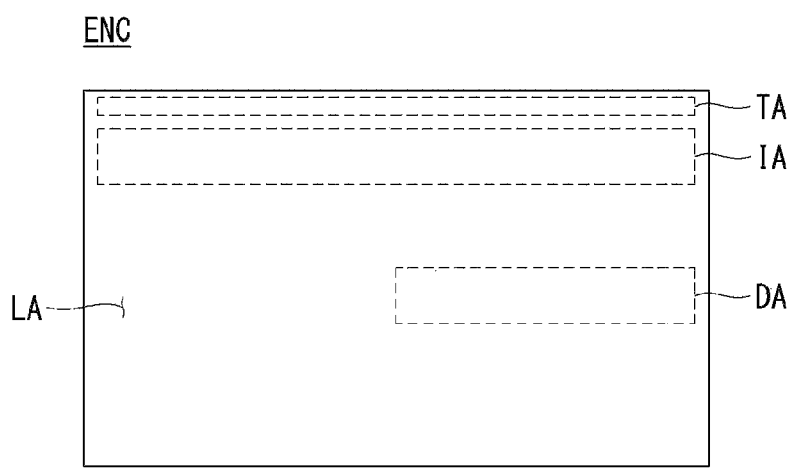
FIG. 11 is a plan view of an encapsulation layer according to another aspect of the present disclosure.
Figure 12:
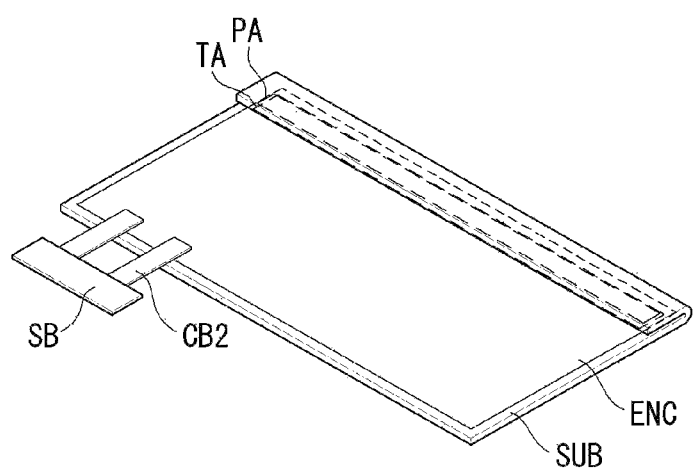
FIG. 12 is a perspective view of a flexible display device according to another aspect of the present disclosure.

FIG. 11 is a plan view of an encapsulation layer according to another aspect of the present disclosure. FIG. 12 is a perspective view of a flexible display device according to the second aspect of the present disclosure.

Referring to FIGS. 11 and 12, the flexible display device according to another aspect of the present disclosure includes a substrate SUB, a pixel array PIX, and an encapsulation layer ENC. The encapsulation layer ENC may include a terminal portion TA, an IC portion IA, a lead portion LA, and an element portion DA. In the case where the encapsulation layer is a metal sheet, at least one insulation layer is further provided on the metal sheet. The flexible display device according to another aspect of the present disclosure is in a structure in which a flexible film 20 (shown in FIG. 5) including driving ICs (IC) mounted thereon and implemented as a COF or a TCP has been removed. In addition, the flexible display device according to another aspect of the present disclosure is in a structure in which a PCB PB (shown in FIGS. 10A to 10C) having passive elements, such as a capacitor and a resistance, mounted thereon has been removed.

The terminal portion TA includes terminals (or bumps) adhered through pads of the pad portion PA and the ACF layer 30. The IC portion IA includes driving ICs IC mounted on the encapsulation layer ENC.

As described above, if driving ICs (IC) having a specific level of rigidity are mounted densely in a limited area, it is difficult to secure a specific level of flexibility which is required to responds to change in state of the display panel. In another aspect of the present disclosure, the driving ICs (IC) may be relatively widely distributed over a large-sized encapsulation layer ENC in order not to limit and restrict change in state of the display panel. In addition, the driving ICs (IC) may be divided by a relatively small size and mounted in order not to limit and restrict change in state of the display panel. In addition, the driving ICs (IC) may be arranged in a zig-zag pattern in one direction (or alternately arranged in a horizontal direction). In another aspect of the present disclosure, the driving ICs (IC) are formed on a relatively large-sized encapsulation layer ENC, thereby securing freedom of design and prevent limitation and restriction to change in state of the display panel. This means that a region where the driving ICs (IC) are provided is a rolling region, unlike the display device according to the related art.

The lead portion LA includes input leads and output leads formed on the encapsulation layer ENC. As shown in FIG. 12, the input leads are connected via a second connection member CB2 to a system board SB provided outside of the substrate SUB so as to electrically connect the system board SB, the driving ICs IC in the IC portion I, and passive elements in the element portion DA. The system board SB and the driving ICS (IC) in the IC portion IA may be connected via the passive elements of the element portion DA. A timing controller and a power generator (not shown) may be mounted on the system board SB. The second connection member CB2 may be a cable such as a flexible flat cable (FFC), but aspects of the present disclosure are not limited thereto. For example, one end of the second connection member CB2 may be adhered to one side of the encapsulation layer ENC via an ACF, and the other end of the second connection member DB2 may be connected to a connector mounted on the system board SB. The output leads connect the driving ICs IC to the terminal portion TA. A signal from the system board SB may be transferred using a wireless transmission method.

In another aspect of the present disclosure, the input leads and the output leads may be relatively widely distributed over a large-sized encapsulation layer ENC in order not to limit and restrict change in state of the display panel. Accordingly, the input leads and the output leads may be arranged with a sufficient distance from each other, thereby possibly minimizing signal interference therebetween. In addition the input leads and the output leads may be formed to have a relative wide width, thereby possibly reducing line resistance. In this case, the input leads and the output leads may achieve a specific level of rigidity, so that it is possible to minimize a probability of crack to occur in the input leads and the output leads OL, the crack which is caused by an external force provided when a state of the display panel is changed. In another aspect of the present disclosure, the input leads IL and the output leads are formed on a relatively large-sized encapsulation layer ENC, thereby securing freedom of design and restrained from limiting and restricting change in state of the display panel.

The element portion DA includes passive elements, such as a capacitor and a resistance, mounted on the encapsulation layer ENC. The passive elements indicate elements which are mounted on an existing PCB PB. In another aspect of the present disclosure, the passive elements are mounted directly on the encapsulation layer ENC. For example, the capacitor may be provided to remove noise, so that a voltage at a constant level can be supplied from the system board SB to the display panel. The resistance may be provided to control a desired amount of currents at a preset location. The input leads, the passive elements, the driving ICS IC, and the output leads are electrically connected to each other on the encapsulation layer ENC to thereby form signal transmission paths.

In the case where passive elements having a specific level of rigidity are mounted densely on a limited area, it is difficult to secure a specific level of flexibility required to respond to a change in state of the display panel. In another aspect of the present disclosure, the passive elements may be relatively widely distributed over a large-sized encapsulation layer ENC in order not to limit and restrict change in state of the display panel. In another aspect of the present disclosure, the passive elements may be formed on a relatively large-sized encapsulation layer ENC, thereby securing freedom of design and refraining from limiting and restricting change in state of the display panel.

Since another aspect of the present disclosure is a structure in which a PCB PB (shown FIGS. 10A to 10C) has been removed, it is possible to significantly reduce a non-winding region more than the previously disclosed aspect of the present disclosure. Another aspect of the present disclosure may provide a flexible display device which has improved in terms of user convenience and esthetic appearance.

When it comes to implementing a flexible display device, it is essential to select a proper location of a PCB PB (shown in FIGS. 10A to 10C) in order to prevent the PCB PB from restricting change in state of the display panel. In this case, the PCB is inevitably disposed far from the display panel, and thus, a line resistance-related issue may lead to a defect in the flexible display panel. Unlike the previously disclosed aspect of the present disclosure, another aspect does not require a connection member (for example, the first connection member CB1 (shown in FIG. 10C) for connecting the display panel and the PCB) to receive a signal from the PCB. That is, the previously described aspect of the present disclosure may need a long line for connecting the display panel and the PCB outside of the display panel to receive and transmit a signal with respect to the PCB, whereas another aspect of the present disclosure deletes the connection member and does not need a long line for transmission of a signal because passive elements forming the PCB (PB) are mounted on the encapsulation layer ENC of the display panel. Thus, another aspect of the present disclosure significantly reduces the line resistance, thereby possibly minimizing a probability of malfunction of the flexible display device.

FIGS. 13A to 13D are a set of diagrams schematically illustrating a method for manufacturing a flexible display device of the related art. FIGS. 14A to 14C are a set of diagrams schematically illustrating a method for manufacturing a flexible display device according to yet another aspect of the present disclosure.

Referring to FIGS. 13A to 13D, a cell process is performed to form a pixel array PIX, a pad portion PA, and an encapsulation layer ENC on a substrate SUB. The substrate SUB is formed of a flexible material, such as polyimide (PI), and thus, the substrate SUB may be easily bent or distorted during the process. Thus, for the sake of convenience of the process, a support substrate GLA having a specific level of rigidity, such as glass, is coated with a material such as PI to form the substrate SUB, and then the cell process starts. Between the support substrate GLA and the substrate SUB, there may be a sacrificial layer which makes it easy to remove the supports substrate GLA (shown in FIG. 13A).

Then, the bonding process is performed to bond a flexible film 20 to a pad portion PA of the substrate SUB. The bonding process is a process by which an ACF layer 30 having adhesive resin and conductive particles spread therein is provided between the pad portion PA of the substrate SUB and a terminal portion TA of the flexible film 20 and then the flexible film 20 and the substrate SUB are pressed. Pads in the pad portion PA and terminals in the terminal portion TA are electrically connected to each other via the conductive particles (shown in FIG. 13B).

Figure 13A:
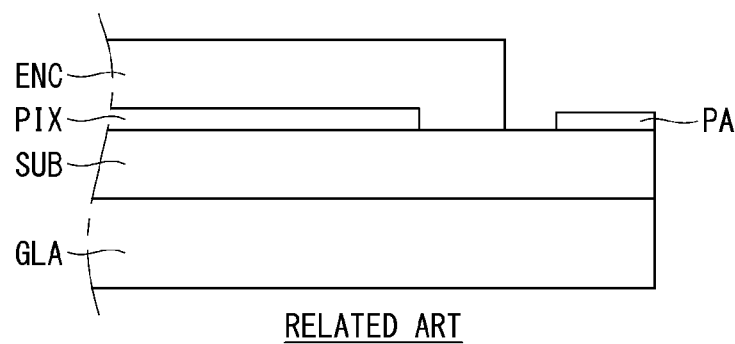
FIGS. 13A to 13D are a set of diagrams schematically illustrating a method for manufacturing a flexible display device of the related art.
Figure 13B:
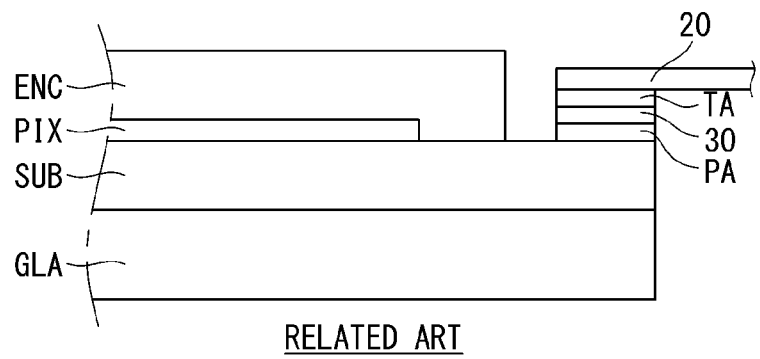
Figure 13C:
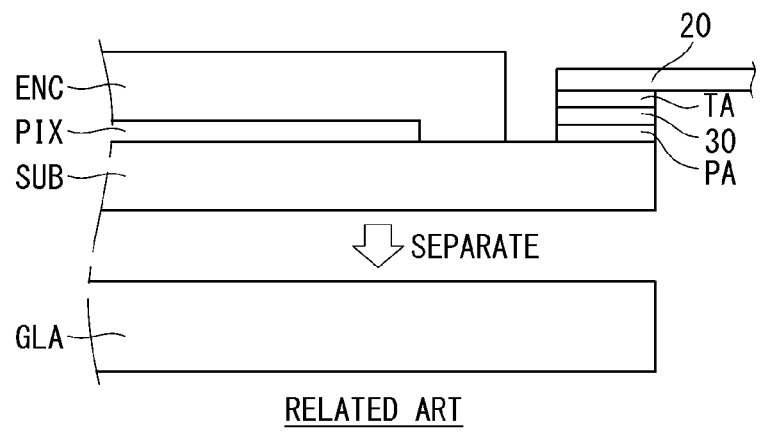
Figure 13D:
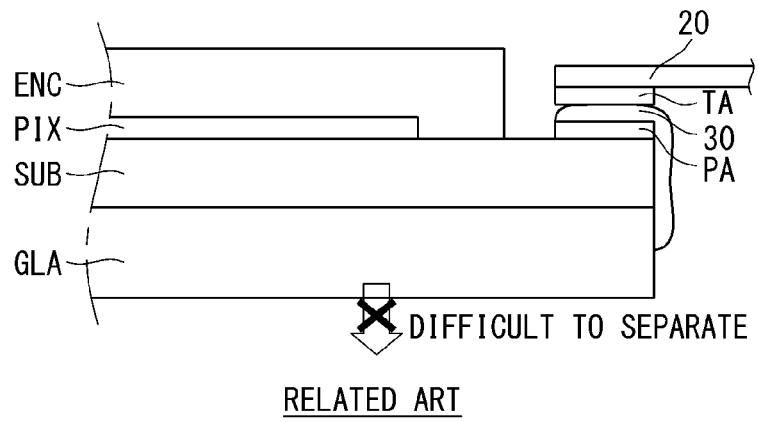
Figure 14A:
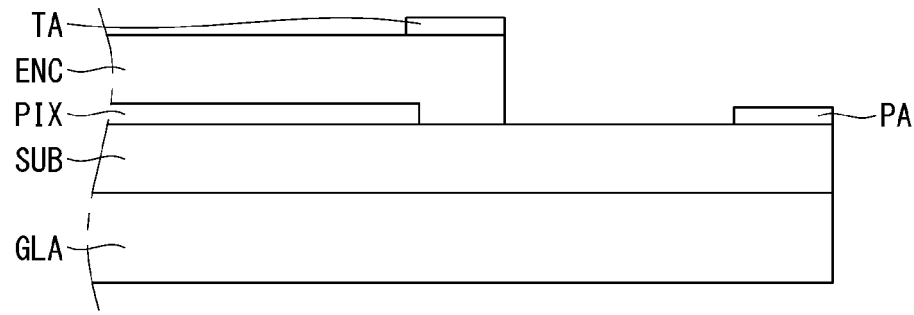
FIGS. 14A to 14C are a set of diagrams schematically illustrating a method for manufacturing a flexible display device according to yet another aspect of the present disclosure.
Figure 14B:
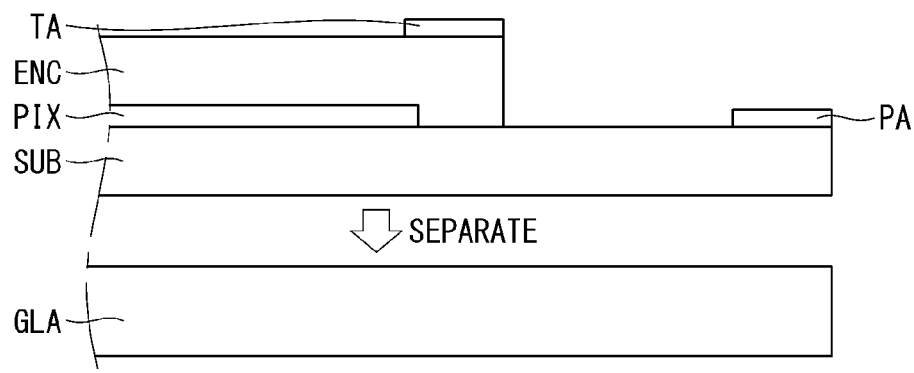
Figure 14C:
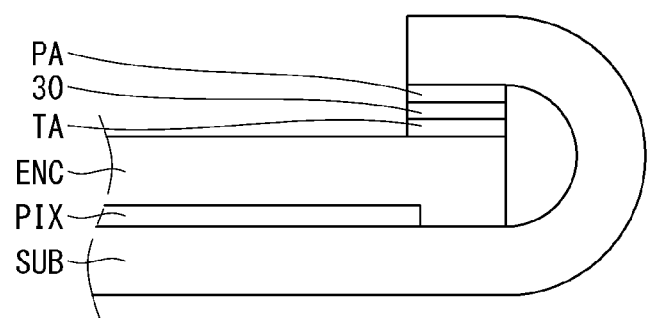

Then a laser lift off (LLO) process is performed to remove the support substrate GLA (shown in FIG. 13C).

The resin of the ACF layer 30 has fluidity before hardening. Due to this characteristic, the resin overflows before the bonding process and thus fails to remain at a preset location and rather flows to the side surface of the support substrate GLA. In this case, during the LLO process, the support substrate GLA cannot be separate from the substrate SUB. It is possible to separate the support substrate GLA by applying a physical force. However, the physical force may damage neighboring lines and cause a signal failure (shown in FIG. 13D).

To prevent the overflow of resin, coating a less amount of resin may be considered. However, this may not provide a sufficiently strong adhesion and thus may cause an adhesive failure. As another way, coating resin at a specific distance inwardly from the side surface of the substrate SUB may be considered. In this case, a bezel region may increase as much as the specific distance.

Referring to FIGS. 14A to 14C, a method for manufacturing the flexible display device according to yet another aspect of the present disclosure includes a first step, a second step, and a third step.

The first step is a step of forming a pixel array PIX, a pad portion PA, and an encapsulation layer ENC on a substrate SUB. First, the substrate SUB is formed by coating a support substrate GLA having a specific level of rigidity with a material such as PI. Between the support substrate GLA and the substrate SUB, there may be a sacrificial layer which makes it easy to remove the supports substrate GLA. Then, the pixel array PIX and the pad portion PA are formed on the substrate, and then the encapsulation layer ENC is formed to cover the pixel array PIX. Then, a terminal portion TA, an IC portion IA, and a lead portion LA are formed on the encapsulation layer ENC (shown in FIG. 14A).

The second step is a step of performing a LLO process to remove the GLA. As the support substrate GLA is removed, the substrate SUB is rendered in a bendable state due to its flexible characteristic (shown in FIG. 14B).

The third step is a step of performing a bonding process to bond the pad portion PA onto the substrate SUB and the terminal portion PA onto the encapsulation layer ENC. First, an end portion of the substrate SUB on which the pad portion PA is provided is bent in a direction toward the rear surface of the flexible display device to thereby align the pad portion PA on the substrate SUB and the terminal portion TA on the encapsulation layer ENC. Then, pads in the pad portion PA and terminals in the terminal portion Ta are adhered with an ACF layer 30 therebetween (shown in FIG. 14C).

The bonding process is performed after the LLO process, and thus, it is possible to prevent a problem caused by a failure of removing the existing support substrate GLA. In addition, the bonding process is performed on the encapsulation layer ENC. It means the bonding process is performed on a relatively large area, thereby securing a sufficiently area for adhesion and the freedom of design.

In the present disclosure, a non-display region of a substrate in which a pad portion is provided is bent in a direction toward the rear surface of a flexible display device, thereby minimizing a bezel region which is recognized from the front surface of the flexible display device. In the present disclosure, driving ICs and leads connected to the driving ICs may be formed on a relatively large-sized encapsulation layer. Accordingly, the present disclosure may secure the freedom of design and prevent the driving ICs from restricting a change in state of the display panel, and therefore, it is possible to provide a flexible display device with improved user convenience.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A flexible display device comprising: a substrate having a flat portion and a curved portion; a pad portion; wherein a pixel array formed on the flat portion, and the pad portion electrically connecting the pixel array and the curved portion of the substrate; and an encapsulation layer on the substrate and covering the pixel array, wherein the encapsulation layer comprises: a terminal portion; an integrated circuit (IC) portion having at least one driving IC; and a lead portion having a plurality of leads which connect the terminal portion and the at least one driving IC portion, wherein the curved portion of the substrate is bent so that the pad portion and the terminal portion are in electrical contact with each other.

2. The flexible display device of claim 1, further comprising:
   a printed circuit board (PCB); and
   a first connection member connecting the PCB and the encapsulation layer to transmit a signal to the driving IC.

3. The flexible display device of claim 1, wherein the encapsulation layer further comprises an element portion which has a capacitor and a resistor.

4. The flexible display device of claim 3, further comprising:
   a system board; and
   a second connection member connecting the system board and the encapsulation layer to transmit a signal to the element portion and the driving IC.

5. The flexible display device of claim 1, wherein the encapsulation layer includes a single layer or multi-layers selected from the group consisting of COP (cyclic olefin polymer), PET (polyethylene terephthalate), PEN (polyethylene naphthalate), PC (polycarbonate), PI (polyimide), PTFE (polytetrafluoroethylene), PE (polyethylene), HDPE (high density polyethylene), PP (polypropylene), PES (polyethersulfone), PS (polystyrene), PVC (polyvinyl chloride).

6. The flexible display device of claim 1, wherein the encapsulation layer comprises a metal material and an insulation material on the metal material.

7. The flexible display device of claim 1, wherein the encapsulation layer includes multi-layers in which an inorganic insulation material and an organic insulation material are deposited alternatively.

8. The flexible display device of claim 1, comprising a plurality of driving ICs, wherein the driving ICs are alternately arranged in a horizontal direction.

9. The flexible display device of claim 1, further comprising:
   a resin filled in an inner space formed by the curved portion.

10. The flexible display device of claim 1, wherein the curved portion has a portion vertically overlapping the flat portion.

11. The flexible display device of claim 1, wherein the terminal portion and the pad portion are connected through an anisotropic conductive film layer.

12. The flexible display device of claim 1, wherein the lead portion includes a plurality of input leads and a plurality of output leads.

13. The flexible display device of claim 12, wherein the plurality of input leads and the plurality of the output leads are distributed sufficient enough on the encapsulation layer not to restrict change in state of the display device.

14. The flexible display device of claim 12, wherein the plurality of input leads and the plurality of output leads are arranged with a distance enough from each other to minimize a signal interference therebetween.

15. The flexible display device of claim 12, wherein the plurality of input leads and the plurality of output leads are formed to have a width wide enough to minimize a line resistance.

16. A method for manufacturing a flexible display device, comprising:
   attaching a substrate on a support substrate having a specific rigidity;
   forming a pixel array and a pad portion connected to the pixel array on the substrate, and forming an encapsulation layer covering the pixel array;
   forming a terminal portion, an integrated circuit (IC) portion, and a lead portion on the encapsulation layer;
   removing the support substrate;
   bending an end portion of the substrate, in which the pad portion is provided, to align the pad portion on the substrate and the terminal portion on the encapsulation layer; and
   bonding the pad portion and the terminal portion with an anisotropic conductive film (ACF) layer therebetween.

17. The method of claim 16, further comprising a laser lift off process prior to the bonding process.

18. The method of claim 16, wherein the bonding process is performed on the encapsulation layer.

19. A flexible display device comprising: a substrate having a flat portion and a curved portion; a pixel array; a pad portion; wherein the pad portion is formed on the curved portion of a non-display region and electrically connects the pixel array and the curved portion of the substrate; an encapsulation layer on the substrate and covering the pixel array, wherein the encapsulation layer includes a terminal portion and an integrated circuit portion, and the terminal portion and the pad portion are in electrical contact with each other; and a plurality of input leads and a plurality of output leads connecting the terminal portion and the integrated circuit portion, wherein the plurality of input leads and the plurality of the output leads are distributed sufficient enough on the encapsulation layer not to restrict change in state of the flexible display device.

20. The flexible display device of claim 19, further comprising at least one of a first connection member connecting a printed circuit board and the encapsulation layer to transmit a signal to the integrated circuit portion or a second connection member connected to a system board disposed outside the substrate.

\* \* \* \* \*